(12) United States Patent
Nakamura (10) Patent No.: US 6,706,558 B2
(45) Date of Patent: Mar. 16, 2004

(54) MANUFACTURING METHOD OF SEMICONDUCTOR DEVICE

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 18 days.

(21) Appl. No.: 10/345,226

(22) Filed: Jan. 16, 2003

(65) Prior Publication Data

US 2003/0235940 A1 Dec. 25, 2003

(30) Foreign Application Priority Data

Jun. 21, 2002 (JP) ........................................ 2002-180846

(51) Int. Cl.[7] .................... H01L 21/44; H01L 21/48; H01L 21/50
(52) U.S. Cl. ........................ 438/110; 438/107; 438/108; 438/113; 438/121; 438/124; 438/127; 438/976
(58) Field of Search ................................ 438/107, 108, 438/110, 113, 121, 124, 127, 976

(56) References Cited

U.S. PATENT DOCUMENTS 6,001,671 A * 12/1999 Fjelstad ...................... 438/112
6,215,179 B1 * 4/2001 Ohgiyama .................. 257/676
6,528,893 B2 * 3/2003 Jung et al. .................. 257/787
6,566,168 B2 * 5/2003 Gang ......................... 438/112
6,586,677 B2 * 7/2003 Glenn ........................ 174/52.2

FOREIGN PATENT DOCUMENTS

| JP | 2000-252388 | 9/2000 |
|---|---|---|
| JP | 2000-252389 | 9/2000 |
| JP | 2000-252390 | 9/2000 |

* cited by examiner

Primary Examiner—David A. Zarneke
(74) Attorney, Agent, or Firm—Volentine Francos, PLLC

(57) ABSTRACT

A plurality of posts 12 having electrical conductivity are formed on a side of a plate member 11. A buffer layer 14 is formed on the side of the plate member 11 so that top ends of the posts 12 are protruded from the buffer layer 14. The semiconductor pellet 17 is mounted on a predetermined position on the top ends of the posts 12. The electrodes of the semiconductor pellet 17 are connected to the top ends of the posts 12 by means of wires 18. A resin portion 20 is formed on the buffer layer 14 so that the resin portion 20 encapsulates the posts 12, the wires 18 and the semiconductor pellet 17. The plate member 11 is removed from the buffer layer 14 and the posts 12, so that the posts 12 are electrically separated from each other. Solder balls 23 are bonded to the bottom ends 21 of the posts 12.

11 Claims, 11 Drawing Sheets

MANUFACTURING METHOD OF SEMICONDUCTOR DEVICE

BACKGROUND OF THE INVENTION

This invention relates to a manufacturing method of a semiconductor device called an area array package, such as BGA (Ball Grid Array) and CSP (Chip Size Package), having connection terminals arranged on a grid. The connection terminals of the semiconductor device are connected to a circuit board, such as a motherboard, containing glass fibers.

The area array package is one of the semiconductor device in which a semiconductor pellet having an integrated circuit formed thereon is encapsulated in a resin member.

The manufacturing method of the semiconductor device is disclosed by, for example, Japanese Laid-Open Patent Publication Nos. 2000-252388, 2000-252389 and 2000-252390. According to these publications, the semiconductor pellet is formed by the following process. First, a metal foil is placed in a mold for encapsulating the semiconductor pellet in a resin member. Electrodes of the semiconductor pellet are electrically connected to predetermined positions of the metal foil by means of bonding wires. Then, the resin member is pressurized and injected into the mold, so that the pellet, the metal foil and, the wires are encapsulated in the resin member.

According the above described Japanese Laid-Open Patent Publication Nos. 2000-252388 and 2000-252390, when the resin member is injected in the mold, the metal foil deforms along the contour of the bottom of the mold, so that concaves are formed in the metal foil. According to the above described Japanese Laid-Open Patent Publication No. 2000-252389, when the resin member is injected in the mold, the metal foil deforms along the contour of the bottom of the mold, so that projections are formed in the metal foil. After the resin member is hardened, the metal foil on the bottom of the resin member is cut into plurality of areas by means of high pressure jet or laser beam, so that respective concaves or projections of the metal foil are electrically separated from each other. According to the above described Japanese Laid-Open Patent Publication Nos. 2000-252388 and 2000-252390, solder balls are bonded to the concaves of the separated areas of the metal foil and form connection terminals. According to the above described Japanese Laid-Open Patent Publication No. 2000-252389, the projections of the separated areas of the metal foil are used as the connection terminals.

In the above described prior arts, the separated areas of the metal foil are in contact with the resin member having a larger thickness compared with the metal foil. Therefore, when the resin member thermally expands and shrinks, the metal foil also expands and shrinks along with the resin member. Thus, the metal foil expands and shrinks according to the thermal expansion coefficient of the resin member.

In contrast, the circuit board to which the connection terminals of the semiconductor device are connected is made of epoxy-based resin mixed with glass fibers. The circuit board thermally expands and shrinks according to its thermal. expansion coefficient that differs from that of the resin member of the semiconductor device.

As a result, the difference in thermal expansion and shrinkage between the metal foil and the circuit board causes a stress between the metal foil and the circuit board. The stress causes a strain in weak portions of the metal foil and the circuit board.

Therefore, in the conventional semiconductor device disclosed by the above described Japanese Laid-Open Patent Publication Nos. 2000-252388 and 2000-252390, the stress is applied to the connection terminals (i.e., the solder balls) between the metal foil and the circuit board, and therefore the connection terminals may be detached from the metal foil or the circuit board. In the semiconductor device disclosed by the above described Japanese Laid-Open Patent Publication No. 2000-252389, the stress is applied between the connection terminals and the mounting surface of the circuit board, and therefore the connection terminals may be detached from the mounting surface of the circuit board.

Moreover, in the conventional manufacturing method of the semiconductor device, the thin metal foil deforms along the contour of the mold during the injection process of the resin member after the wires are connected to the metal foils. Therefore, when the metal foil deforms in the mold, the wires connected to the metal foils may contact each other.

Further, in the conventional manufacturing method of the semiconductor device, during the cutting process of the metal foil, the metal foil may be detached from the resin member, and the wires may be cut or disconnected from the metal foil. In addition, the cutting process of the metal foil requires a long time to operate.

Furthermore, in the manufacturing method disclosed by the above described Japanese Laid-Open Patent Publication Nos. 2000-252388 and 2000-252390, an oxide film may be formed on the metal foil because of the heat applied when the wires are bonded to the metal foil and when the resin member is injected in the mold. Such an oxide foil may cause a poor connection of the solder ball.

SUMMARY OF THE INVENTION

An object of the present invention is to provide a manufacturing method of a semiconductor device capable of solving the above described problems.

According to the invention, there is provided a manufacturing method of a semiconductor device. The semiconductor device comprises a semiconductor pellet having an integrated circuit and a plurality of electrodes formed thereon, a resin portion encapsulating the semiconductor pellet, and a plurality of connection terminals to be mounted to a circuit board. The connection terminals are electrically connected to the electrodes. The manufacturing method comprises the step of forming a plurality of electrical conductive posts on a side of a plate member. Each post has first and second ends. The second end contacts the plate member. The manufacturing method further comprises the step of forming a buffer layer on the side of the plate member so that the first ends of the posts are protruded from the buffer layer. The buffer layer supports the posts and is able to thermally expand and shrink according to the thermal expansion and shrinkage of the circuit board. The manufacturing method further comprises the steps of mounting the semiconductor pellet on a predetermined position on the first ends of the posts, and connecting the electrodes of the semiconductor pellet to the first ends of the posts corresponding to the electrodes by means of wires, forming the resin portion on the buffer layer so that the resin portion encapsulates the posts, the wires and the semiconductor pellet, removing the plate member, and forming a plurality of connection terminals on the second ends of the posts.

According to the above method, the buffer layer thermally expands and shrinks according to the thermal expansion and shrinkage of the circuit board, and therefore it is possible to prevent the detachment of the solder balls from the second ends of the posts or mounting surfaces of the circuit board.

Further, the posts do not deform by the pressure when the resin portion is formed, and therefore it is possible to prevent the contact between the wires connected to the posts because of the deformation of the posts.

Moreover, the posts can be electrically separated from each other by removing the plate member, and therefore it is not necessary to provide a cutting process for electrically separating the posts. As a result, the chippings are not generated, and the total manufacturing time can be reduced.

Additionally, there is little chance for an oxide layer to be formed on the bottom of the posts, and therefore the detachment of the wires from the posts can be prevented.

DETAILED DESCRIPTION OF THE INVENTION

Embodiments of the present invention will be described with reference to the attached drawings.

Embodiment 1.

FIGS. 1 through 10 illustrate the manufacturing method of a semiconductor device 10, such as BGA and CSP, having connection terminals arranged on a grid according to Embodiment 1.

The semiconductor device 10 according to Embodiment 1 is mounted on a mounting surface of a not-shown circuit board such as a mother board, by means of so-called solder screen printing. The circuit board is made of epoxy-based resin mixed with glass fibers.

Figure 1A:
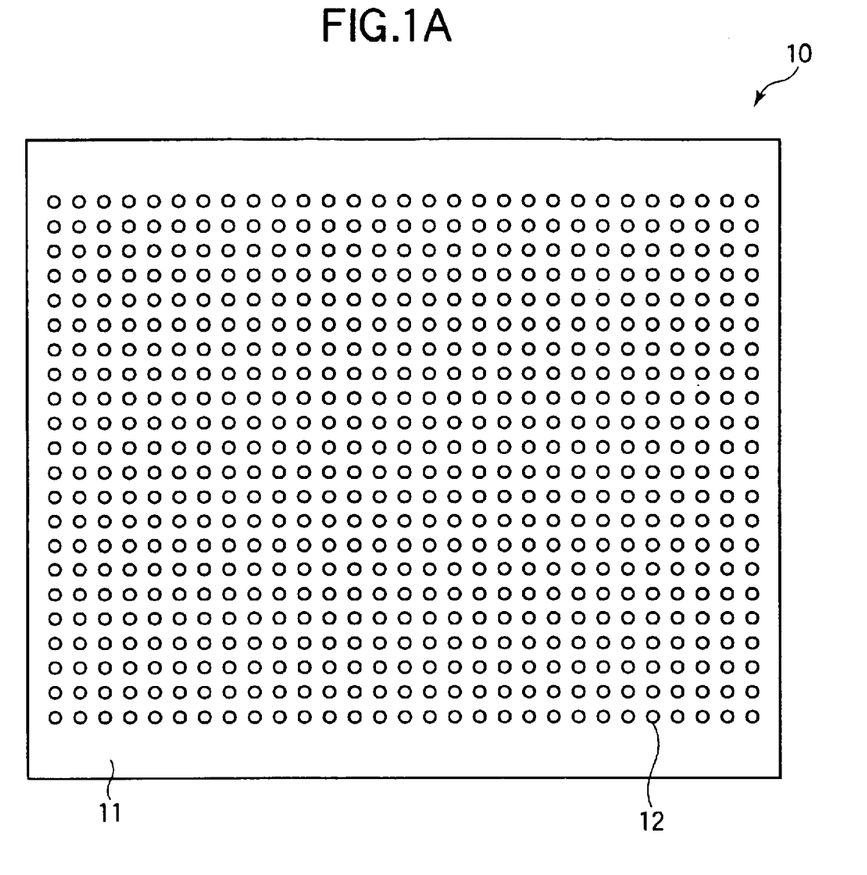
FIGS. 1A and 1B are a plan view and a sectional view illustrating the process of forming posts and a plate member according to Embodiment 1 of the present invention.
Figure 1B:
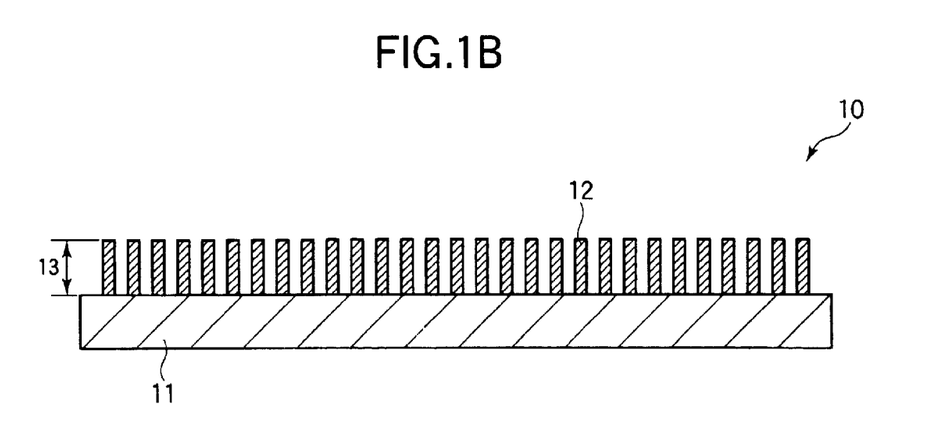

FIGS. 1A and 1B are a plan view and a sectional view illustrating the process of forming posts 12 and a plate member 11 according to Embodiment 1. As shown in FIGS. 1A and 1B, the posts 12 having electrical conductivity are formed on the upper side of the plate member 11 containing copper as the main ingredient.

The plate member 11 and the posts 12 are made from an electrically conductive plate containing copper as the main ingredient. The conductive plate has the uniform thickness from 50 $\mu$m to 400 $\mu$m. A not-shown mask having circular patterns arranged on a grid is formed on the upper side of the conductive plate, and the conductive plate is etched by a known etching method, so that the posts 12 in the shape of column and the plate member 11 are integrally formed. The height 13 of the posts 12 is set to ⅓ of the thickness of the plate member 11.

Figure 2A:
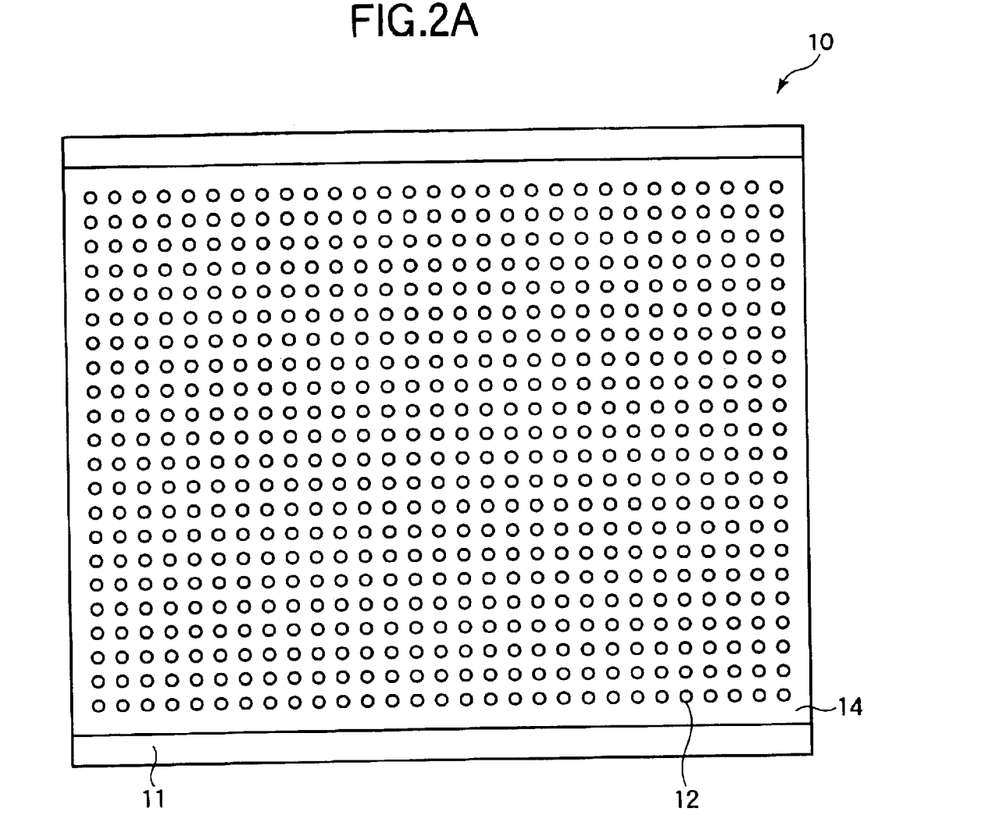
FIGS. 2A and 2B are a plan view and a sectional view illustrating the process of forming a buffer layer on the plate member according to Embodiment 1.
Figure 2B:
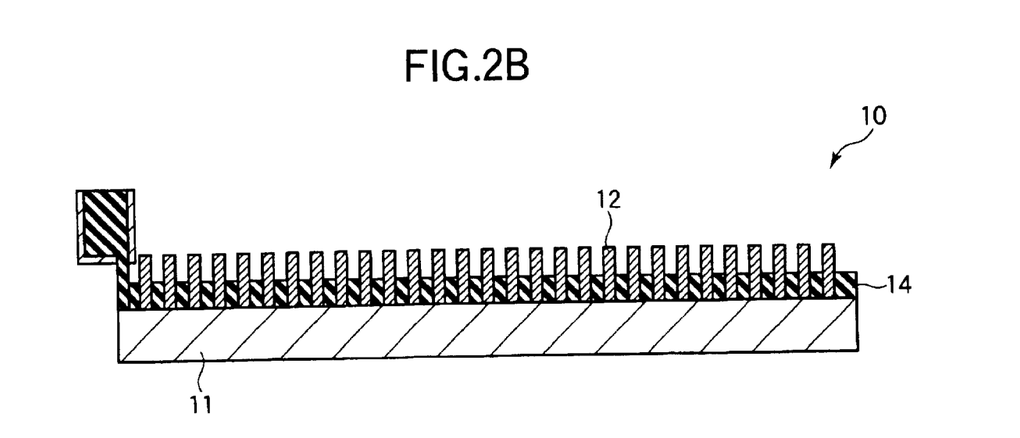

FIGS. 2A and 2B are a plan view and a sectional view illustrating the process of forming a buffer layer on the plate member 11. As shown in FIGS. 2A and 2B, after the posts 12 and the plate member 11 are formed, the buffer layer 14 is formed on the upper side of the plate member 11 on which the posts 12 are formed, in such a manner that the top ends of the posts 12 are protruded from the buffer layer 14. The buffer layer 14 is made of insulating material mixed with glass fibers, which is the same as the circuit board on which the semiconductor device 10 is to be mounted. To be more specific, the buffer layer 14 is made of epoxy-based resin mixed with glass fibers.

Figure 3:
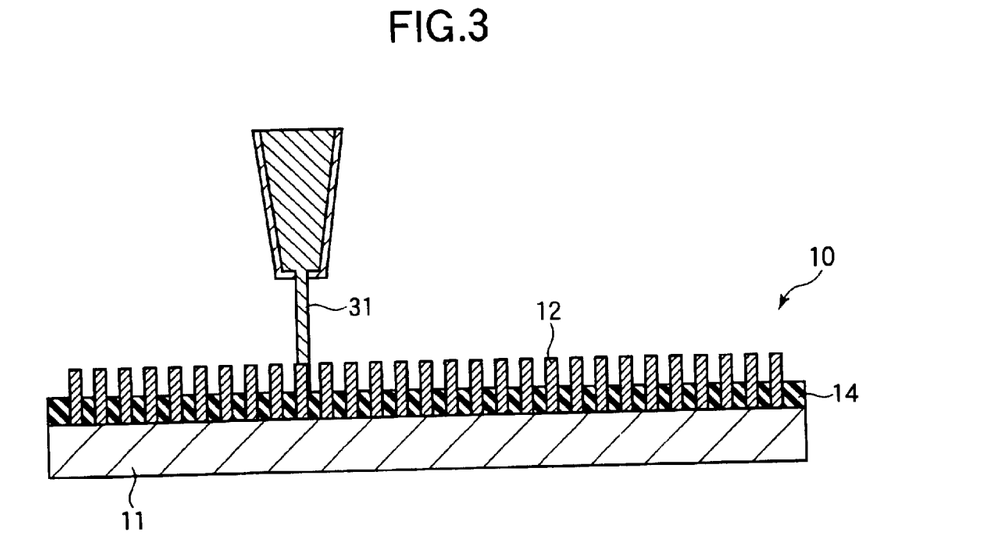
FIG. 3 is a sectional view illustrating the process of cleaning the posts and the buffer layer according to Embodiment 1.

FIG. 3 is a sectional view illustrating the process of cleaning the posts 12 and the buffer layer 14. As shown in FIG. 3, after the buffer layer 14 is formed, the buffer layer 14 and the posts 12 protruded from the buffer layer 14 are cleaned by means of cleaning fluid containing abrasive. The cleaning fluid removes contaminants that have been adhered to the buffer layer 14 and the posts 12 in the forming process of the buffer layer 14.

Figure 4:
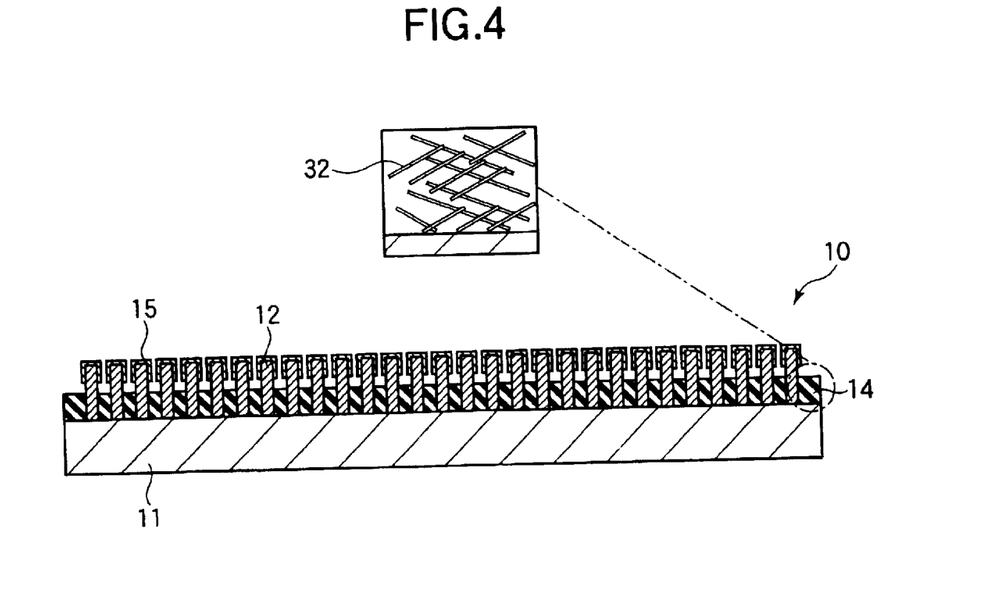
FIG. 4 is a sectional view illustrating the process of forming a plated layer on the posts according to Embodiment 1.

FIG. 4 is a sectional view illustrating the process of forming plated layers 15 on the posts 12. As shown in FIG. 4, after the cleaning of the posts 12 and the buffer layer 14 is completed, the top ends of the posts 12 are plated with an alloy containing gold as the main ingredient, so that the plated layers 15 are formed on the top ends of the posts 12.

By providing the plated layers 15, wires can be easily connected to the top ends of the posts 12 in a wire bonding process, and the electrical loss between the top ends of the posts 12 and the wires can be reduced.

Figure 5A:
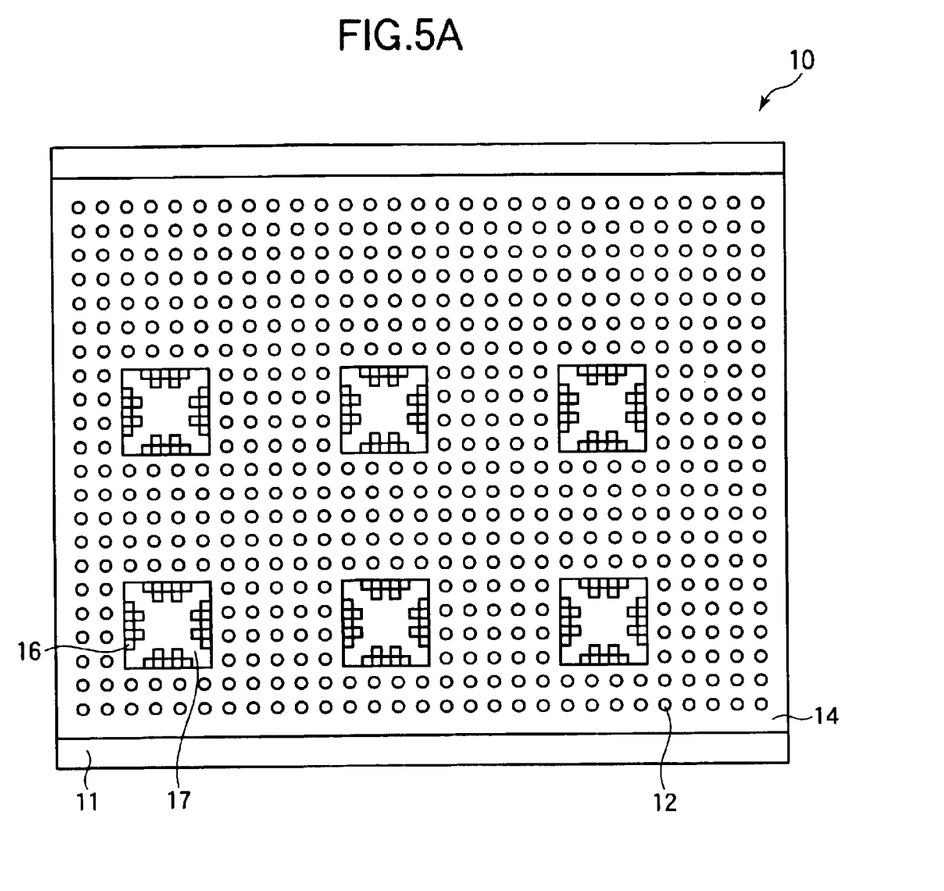
FIGS. 5A and 5B are a plan view and a sectional view illustrating the process of mounting semiconductor pellets on the posts according to Embodiment 1.
Figure 5B:
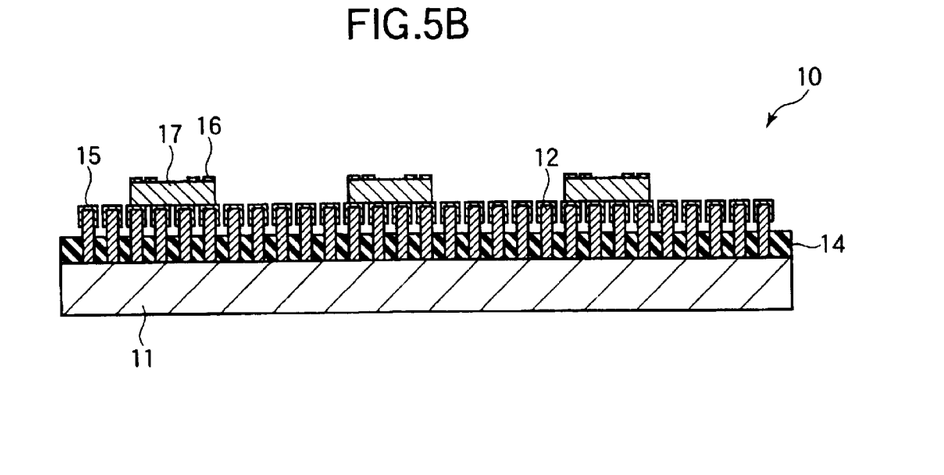

FIGS. 5A and 5B are a plan view and a sectional view illustrating the process of mounting semiconductor pellets 17 on the top ends of the posts 12. As shown in FIGS. 5A and 5B, after the plated layers 15 are formed, the semiconductor pellets 17 are placed on the predetermined positions on the top ends of the posts 12, and fixed to the top ends of the posts 12 by means of adhesive agent. Each semiconductor pellet 17 has an integrated circuit (not shown) and electrodes 16 for transmitting output signal from the integrated circuit and input signal to the integrated circuit.

Figure 6:
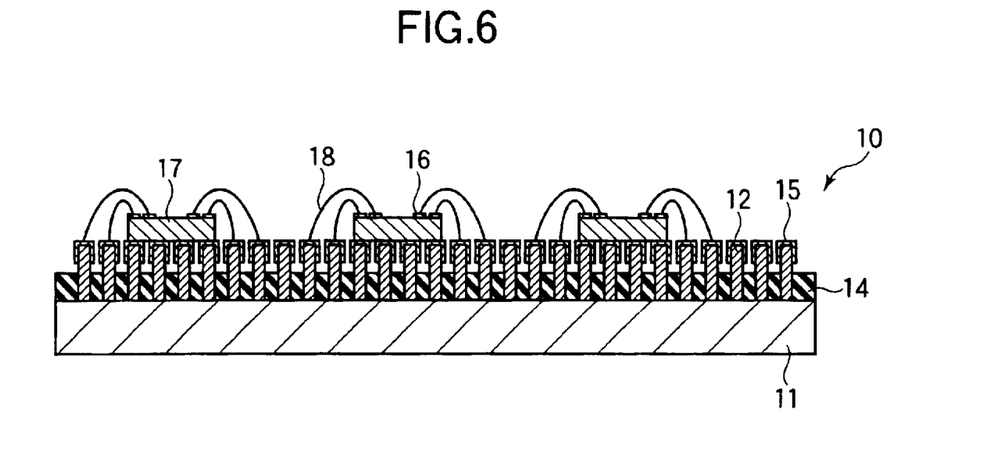
FIG. 6 is a sectional view illustrating the process of connecting the electrodes of the semiconductor pellets to the posts according to Embodiment 1.

FIG. 6 is a sectional view illustrating the process of connecting the electrodes 16 of the semiconductor pellets 17 to the top ends of the post 12. As shown in FIG. 6, after the semiconductor pellets 17 are mounted on the posts 12, the electrodes 16 of the semiconductor pellets 17 are electrically connected to the plated layers 15 on the posts 12 corresponding to the electrodes 16, by means of electrically conductive wires 18. This process is called a wire bonding process.

Figure 7:
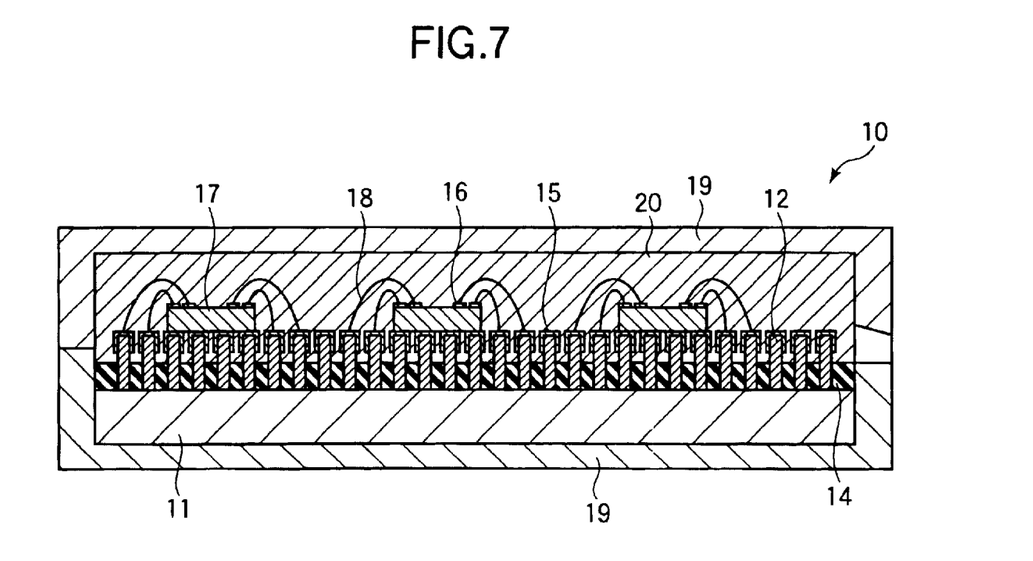
FIG. 7 is a sectional view illustrating the process of encapsulation of the semiconductor pellets according to Embodiment 1.

FIG. 7 is a sectional view illustrating the process of encapsulation of the semiconductor pellets 17. As shown in FIG. 7, after the wire bonding process is completed, the semiconductor pellets 17 and the plate member 11 are placed in the mold 19 used for resin encapsulation. In the mold 19, a resin portion 20 is formed in such a manner that the upper portions of the posts 12, the wires 18 and the semiconductor pellets 17 are encapsulated in the resin portion 20. As a result, a resin encapsulation body in which a plurality of semiconductor pellets 17 are encapsulated in the resin portion 20 is formed.

Figure 8:
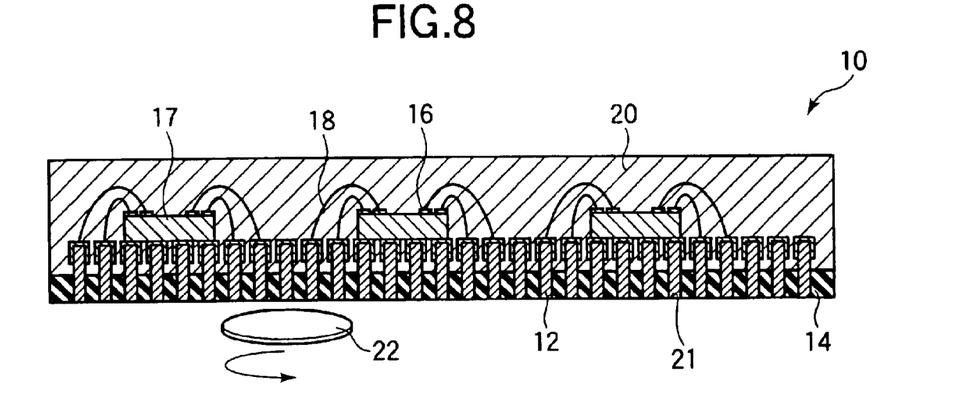
FIG. 8 is a sectional view illustrating the process of removing the plate member from the buffer layer and the posts according to Embodiment 1.

FIG. 8 is a sectional view illustrating the process of removing the plate member 11 from the buffer layer 14 and the posts 12 by means of a grinder. As shown in FIG. 8, after the resin portion 20 is formed, the resin encapsulation body is taken from the mold 19. The grinder 22 grinds the lower side (i.e., the side opposite to the posts 12) of the plate member 11. The grinder 22 continues to grind the plate member 11 until the grinder 22 reaches the bottom ends 21 of the posts 12, so that the plate member 11 is removed from the posts 12 and the buffer layer 14. By removing the plate member 11, the posts 12 are electrically separated from each other, and the bottom ends 21 of the posts 12 are exposed.

Figure 9:
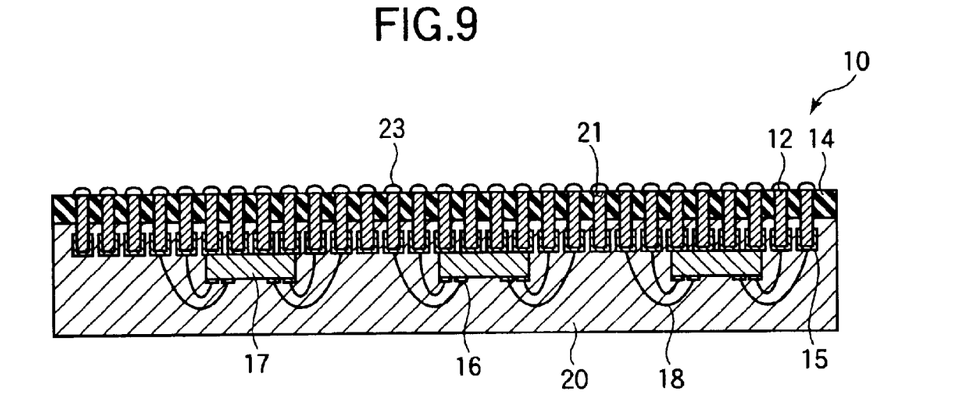
FIG. 9 is a sectional view illustrating the process of bonding solder balls on the posts according to Embodiment 1.

FIG. 9 is a sectional view illustrating the process of boding solder balls 23 on the posts 12. As shown in FIG. 9, after the grinding process is completed, the solder balls 23 are respectively bonded to the bottom ends 21 of the posts 12. Instead of solder balls 23, it is also possible to form solder layers on the bottom ends 21 of the posts 12 by means of solder screen printing or the like. As a result, a plurality of contact terminals are formed.

Figure 10:
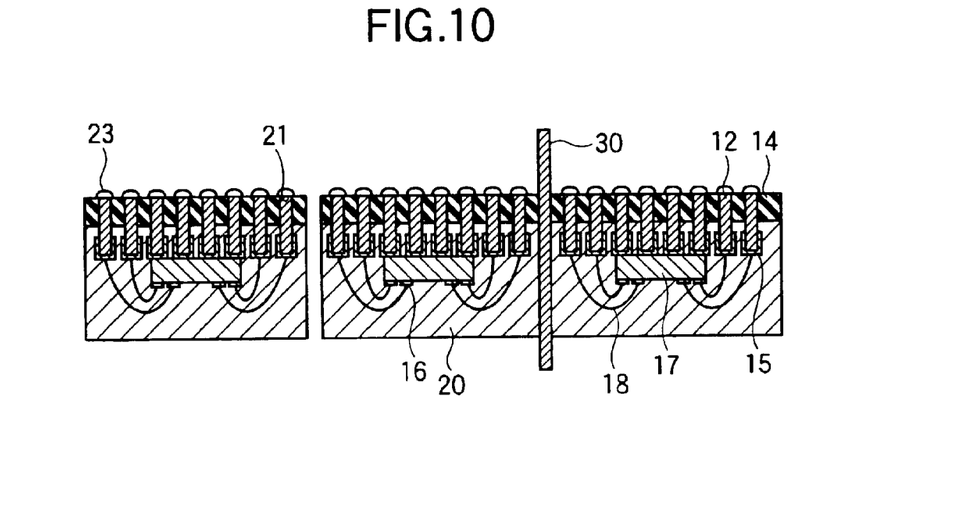
FIG. 10 is a sectional view illustrating the process of separating the semiconductor devices from each other according to Embodiment 1.

FIG. 10 is a sectional view illustrating the process of separating respective semiconductor devices from each other. As shown in FIG. 10, after the solder balls 23 are bonded to the bottom ends 21 of the posts 12, the resin encapsulation body is cut by the high-speed rotation blade 30, so that a plurality of semiconductor devices 10 are separated from each other.

According to the manufacturing method of Embodiment 1, the posts 12 do not deform by the pressure when the resin portion 20 is formed, and therefore it is possible to reduce the possibility that the wires 18 connected to the top ends of the posts 12 may contact each other.

Moreover, compared with the conventional manufacturing method in which the contact terminals are connected to a metal foil, it is possible to eliminate a cutting process of the metal foil.

In addition, the electrical separation of the posts 12 is accomplished by the grinding process, and therefore the total manufacturing time can be reduced.

Further, the bottom ends 21 of the posts 12 are formed by the removal of the plate member 11, and therefore there is little chance for an oxide film to be formed on the bottom ends 21 of the posts 12. Thus, the bottom ends 21 of the posts 12 are suitable for bonding the solder balls 23.

Furthermore, according to the manufacturing method of Embodiment 1, the resin portion 20 is made of a known insulating resin suitable for encapsulating the semiconductor pellets 17, the wires 18 and the posts 12. In contrast, the buffer layer 14 is made of the same material as the circuit board, i.e., epoxy-based insulation resin mixed with glass fibers. That is, the thermal expansion coefficient of the buffer layer 14 is substantially the same as that of the circuit board. In other word, the buffer layer 14 that supports the posts 12 thermally expands and shrinks according to the expansion and shrinkage of the circuit board.

Figure 11:
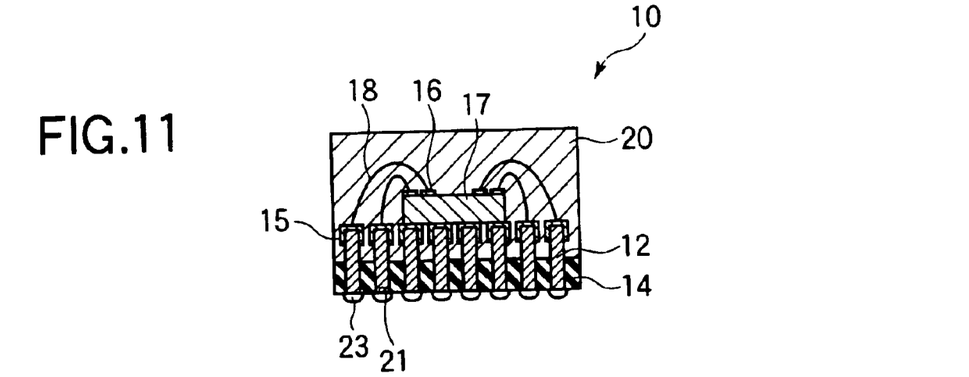
FIG. 11 is a sectional view illustrating the semiconductor device according to Embodiment 1.

FIG. 11 is a sectional view illustrating the semiconductor device 10 manufactured by the above described manufacturing process. The semiconductor device 10 shown in FIG. 11 includes the posts 12, the semiconductor pellet 17, the wires 18, the resin portion 20 and the buffer layer 14. The plated layer 15 is formed on the top ends of the posts 12. The solder balls 23 as the contact terminals are bonded to the bottom ends 21 of the posts 12. The semiconductor pellet 17 has the electrodes 16 and is placed on the posts 12. The electrodes 16 of the semiconductor pellet 17 are electrically connected to the posts 12 corresponding to the electrodes 16, by means of the wires 18. The resin portion 20 encapsulates the semiconductor pellet 17, the wires 18 and the posts 12 The buffer layer 14 supports the posts 12 in such a manner that the top ends of the posts 12 are protruded therefrom. The solder balls 23 are bonded to the bottom ends 21 of the posts 12 and mounted to the mounting surfaces of the circuit board.

Since the buffer layer 14 contains glass fibers, the buffer layer 14 that supports the posts 12 thermally expands and shrinks according to the thermal expansion and shrinkage of the circuit board. Thus, it is possible to prevent the generation of a strain caused by the difference in thermal expansion coefficient between the bonding surfaces of the posts 12 and the mounting surfaces of the circuit board. As a result, it is possible to prevent the detachment of the solder balls 23 from the bonding surfaces of the bottom ends 21 of the posts 12 or from the mounting surfaces of the circuit board.

Figure 12:
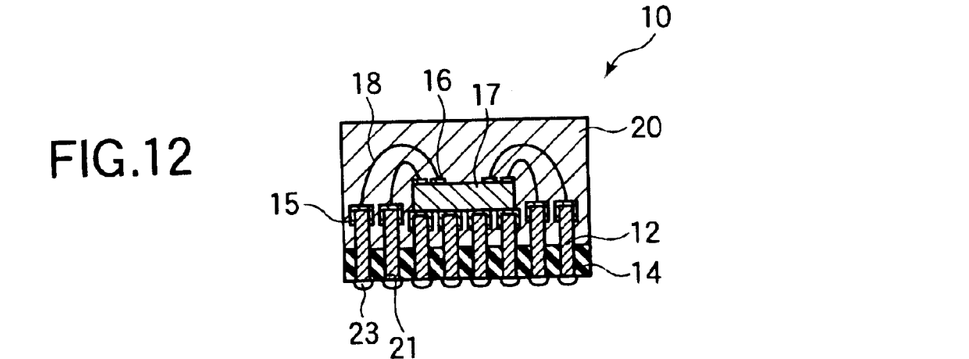
FIG. 12 is a sectional view illustrating a modified structure of the semiconductor device according to Embodiment 1.

FIG. 12 is a sectional view illustrating a modification of the semiconductor device according to Embodiment 1. In the semiconductor device 10 shown in FIG. 12, the heights of the posts 12 on which the semiconductor pellet 17 is placed are lower than the heights of the posts 12 on which the semiconductor pellet 17 is not placed. The lower posts 12 are formed by means of half-etching method, in the above described forming process of the posts 12.

According to the semiconductor device 10, since the heights of the posts 12 on which the semiconductor pellet 17 is placed are lower than the heights of the other posts 12, the thickness of the resin portion 20 can be reduced. Therefore, according to the modification of Embodiment 1, the size of the semiconductor device 10 can be reduced, in addition to the advantages of the above describe semiconductor device 10 according to Embodiment 1.

Figure 13:
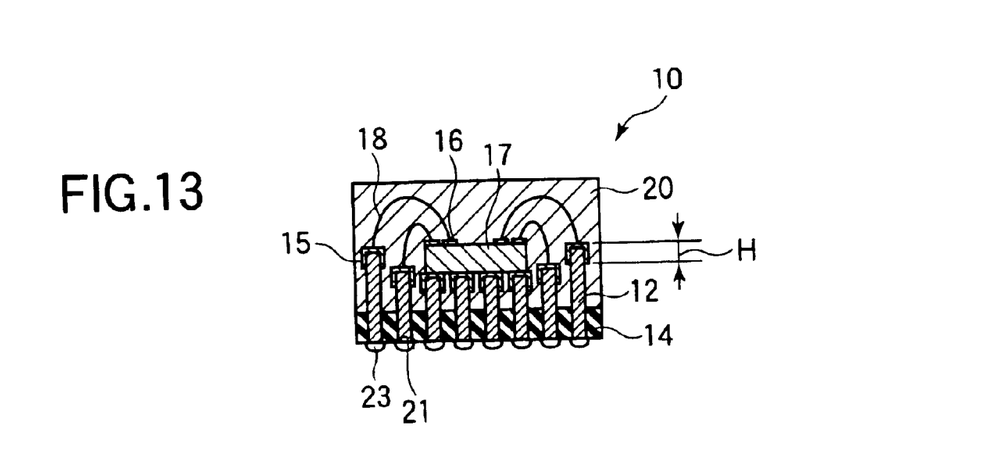
FIG. 13 is a sectional view illustrating another modified structure of the semiconductor device according to Embodiment 1.

FIG. 13 is a sectional view illustrating another modification of the semiconductor device according to Embodiment 1. In the semiconductor device 10 shown in FIG. 13, the heights of the posts 12 on which the semiconductor pellet 17 is placed are lower than the heights of the other posts 12 on which the semiconductor pellet 17 is not placed. Further, among the posts 12 on which the semiconductor pellet 17 is not placed, the heights of the posts 12 increase as the distance from the semiconductor pellet 17 increases. The difference between the heights of the higher and lower posts 12 adjacent to each other is greater than the diameter of the wire 18. The lower posts 12 are formed by means of half-etching method, in the above described forming process of the posts 12.

As constructed above, according to the semiconductor device 10 of the modification, even when the wire 18 slackens because of the weight of the wire 18, the possibility that the slackening wire 18 contacts the adjacent wire 18 or the adjacent post 12 can be reduced.

Embodiment 2.

In the manufacturing method according to Embodiment 1 shown in FIGS. 1 through 10, the electrical separation of the posts 12 are accomplished by grinding the plate member 11. In contrast, in the manufacturing method according to Embodiment 2, the electrical separation of the posts 12 are accomplished by melting the plate member.

FIGS. 14 through 19 are sectional views illustrating the manufacturing method according to Embodiment 2 of the present invention.

Figure 14:
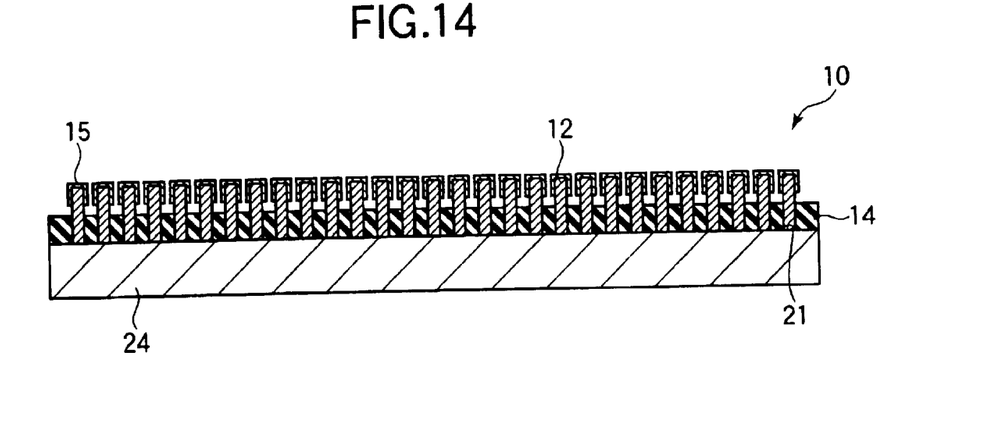
FIG. 14 is a sectional view illustrating the process of forming posts and a buffer layer on a solder plate according to Embodiment 2.

FIG. 14 is a sectional view illustrating the process of forming posts 12 and a buffer layer 14 on a solder plate 24. As shown in FIG. 14, the solder plate 24 has a constant thickness. The posts 12 are formed on the upper side of the solder plate 24 in such a manner that the posts 12 are arranged on a grid as in Embodiment 1. Plated layers 15 are formed on the top ends of the posts 12. The buffer layer 14 is formed on the upper side of the solder plate 24 in such a manner that the top ends of the posts 12 are protruded from the buffer layer 14.

To be more specific, the posts 12 are formed by injecting a molten alloy containing copper as the main ingredient into a mold having a plurality of cylindrical cavities. The molten alloy is hardened in the cylindrical cavities of the mold, so that the posts 12 are formed. After the posts 12 are formed, a molten alloy containing solder as the main ingredient is injected into the mold at the bottom ends of the posts 12. The melting point (220–240 degree centigrade) of the alloy is lower than that of copper. By hardening the alloy, the solder plate 24 is formed at the bottom ends of the posts 12.

After the solder plate 24 is formed, the buffer layer 14 containing glass fibers is formed on the upper side of the solder plate 24 on which the posts 12 are formed, in such a manner that the top ends of the posts 12 protruded from the buffer layer 14. After the buffer layer 14 is formed, the buffer layer 14 and the posts 12 protruded from the buffer layer 14 are cleaned by means of cleaning fluid containing abrasive. Then, the top ends of the posts 12 are plated with an alloy containing gold as the main ingredient, so that the plated layers 15 are formed on the top ends of the posts 12.

Figure 15:
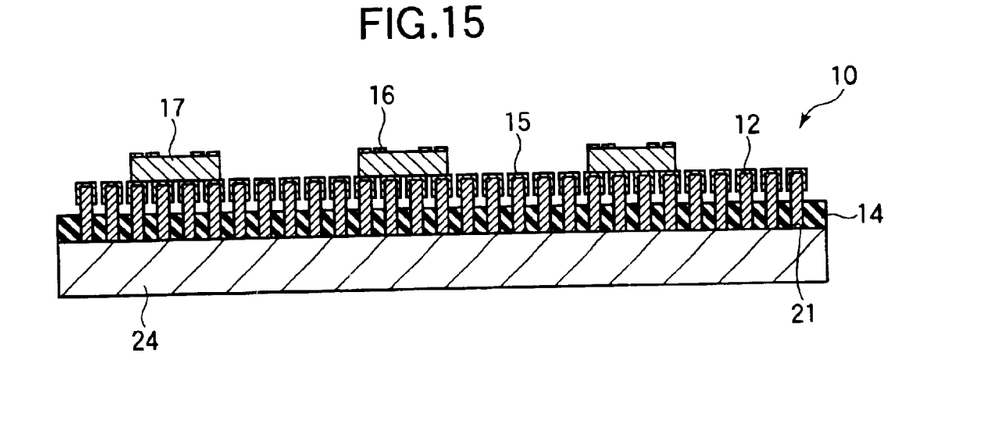
FIG. 15 is a sectional view illustrating the process of mounting semiconductor pellets on the posts according to Embodiment 2.

FIG. 15 is a sectional view illustrating the process of mounting semiconductor pellets 17 on the posts 12. As shown in FIG. 15, after the plated layers 15 are formed, the semiconductor pellets 17 having electrodes 16 formed thereon are placed on the predetermined positions on the top ends of the posts 12, and fixed to the top ends of the posts 12 by means of adhesive agent.

Figure 16:
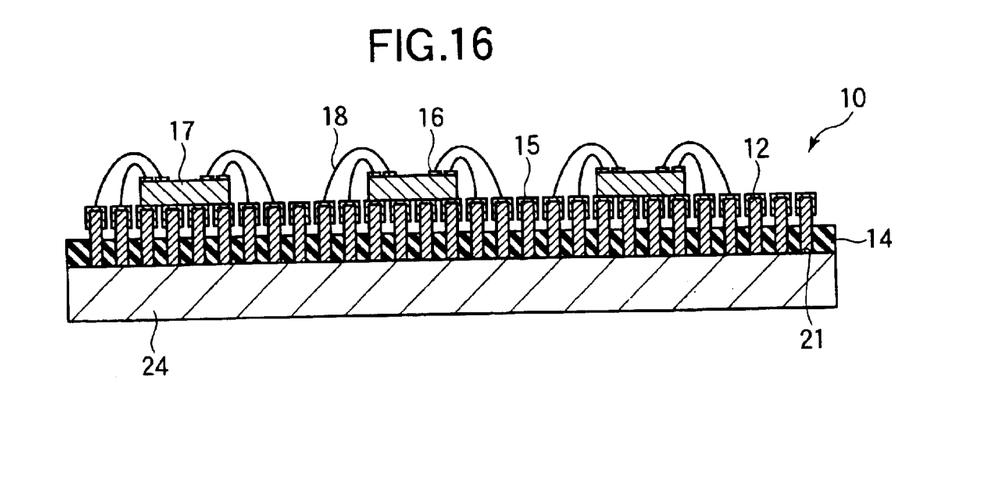
FIG. 16 is a sectional view illustrating the process of connecting the electrodes of the semiconductor pellets to the posts according to Embodiment 2.

FIG. 16 is a sectional view illustrating the process of connecting the electrodes of the semiconductor pellets 17 and the posts 12. As shown in FIG. 16, after the semiconductor pellets 17 are mounted on the posts 12, the wire bonding is performed. A plurality of electrodes 16 of the semiconductor pellets 17 are electrically connected to the plated layers 15 on the top ends of the posts 12 corresponding to the electrodes 16 by means of the conductive wires 18.

Figure 17:
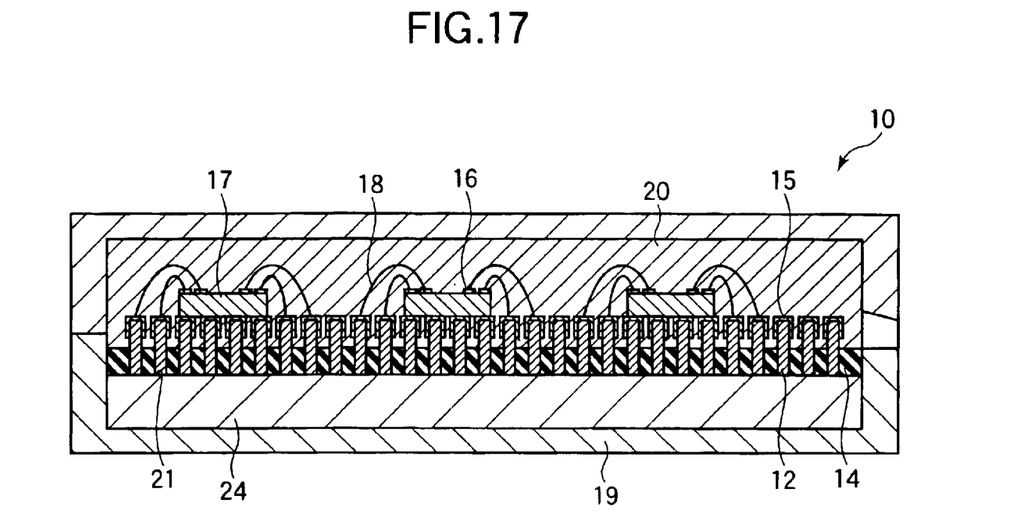
FIG. 17 is a sectional view illustrating the process of encapsulation of the semiconductor pellets according to Embodiment 2.

FIG. 17 is a sectional view illustrating the process of the encapsulation of the semiconductor pellets 17. As shown in FIG. 17, after the wire bonding process is completed, the semiconductor pellets 17 and the solder plate 24 are placed in the mold 19 for resin encapsulation. In the mold 19, the resin portion 20 is formed so that the upper portions of the posts 12, the wires 18 and the semiconductor pellets 17 are encapsulated in the resin portion 20. As a result, the resin encapsulation body in which a plurality of semiconductor pellets 17 are encapsulated in the resin portion 20 is formed.

Figure 18:
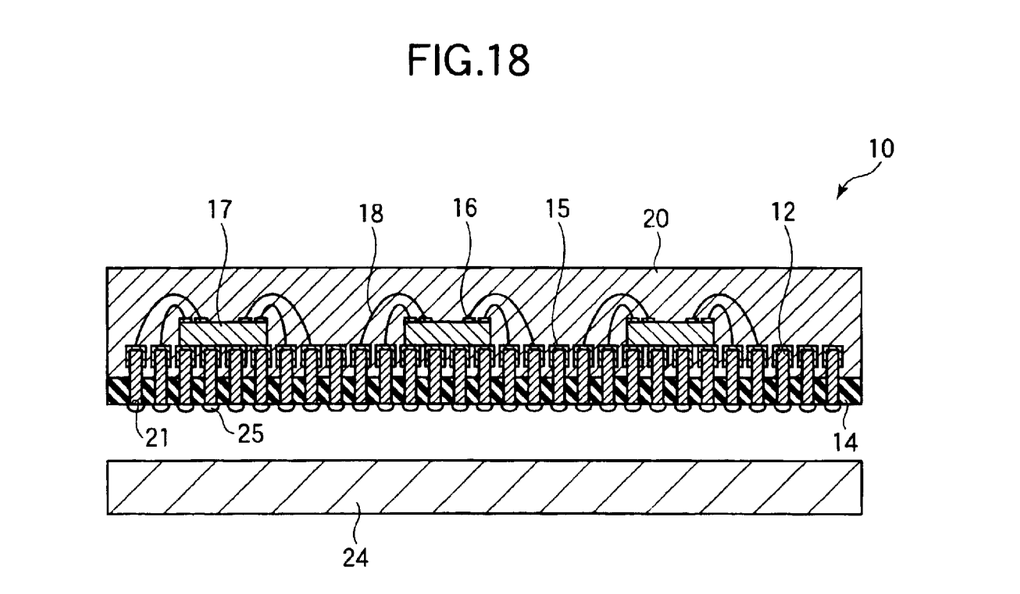
FIG. 18 is a sectional view illustrating the process of removing the solder plate from the posts and the buffer layer according to Embodiment 2.

FIG. 18 is a sectional view illustrating the process of removing the solder plate 24 from the buffer layer 14 and the posts 12. As shown in FIG. 18, after the resin portion 20 is formed, the solder plate 24 is heated so that only the solder plate 24 melts. When the solder plate 24 melts, the resin encapsulation body is lifted up by means of a not-shown jig. The molten solder plate 24 is removed from the posts 12 and the buffer layer 14, so that the posts 12 are separated from each other. A part of the molten alloy remains at the bottom ends 21 of the posts 12 because of the surface tension, and therefore solder layers 25 are formed on the bottom ends 21 of the posts 12. The solder layers 25 are used as contact terminals.

Figure 19:
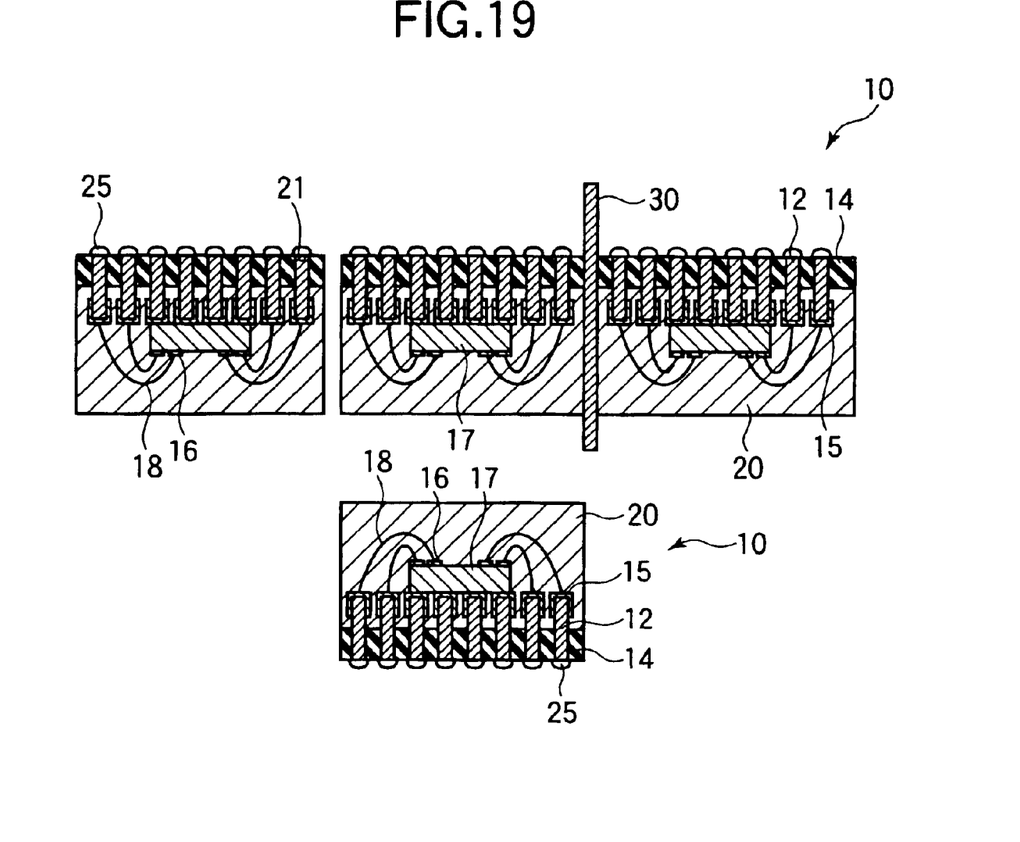
FIG. 19 is a sectional view illustrating the process of separating the semiconductor devices from each other according to Embodiment 2.

FIG. 19 is a sectional view illustrating the process of separating the semiconductor devices 10. As shown in FIG. 19, after the solder layers 25 are formed on the bottom ends 21 of the posts 12, the resin encapsulation body is cut by means of the high-speed rotation blade 30, so that a plurality of semiconductor devices 10 are separated from each other.

According to the manufacturing method of Embodiment 2, the bottom ends 21 of the posts 12 are kept in contact with the solder plate 24 during the manufacturing process of the semiconductor device 10. Thus, the bottom ends 21 of the posts 12 are not exposed to the air. Therefore, the semiconductor device 10 has an advantage that the oxidation of the bottom ends 21 of the posts 12 can be prevented, in addition to the advantages of Embodiment 1. Moreover, the bonding strength between the bottom ends 21 of the posts 12 and the solder layers 25 can be enhanced.

Further, the solder layers 25 are formed on the bottom ends 21 of the posts 12 when the solder plate 24 is molten and separated from the posts 12 and the buffer layer 14, and therefore the process of forming the contact terminals can be eliminated. Thus, the total manufacturing time of the semiconductor device 10 can be reduced.

Figure 20:
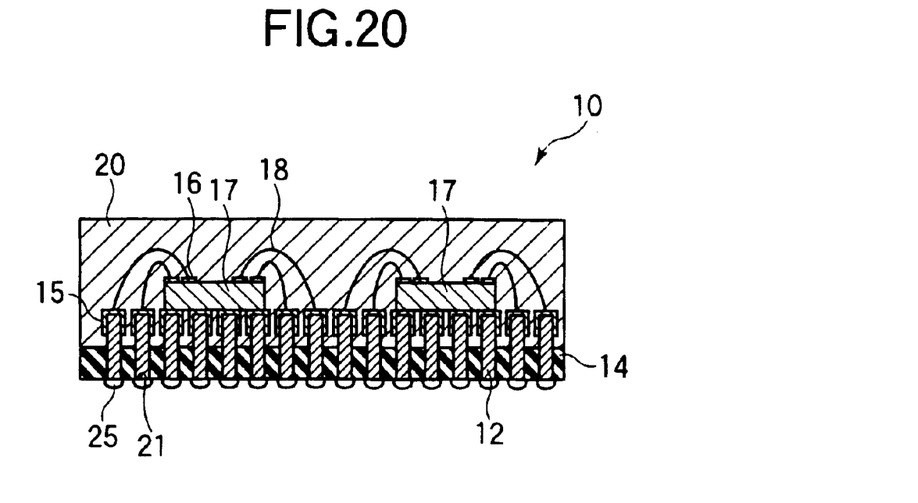
FIG. 20 is a sectional view illustrating a modified structure of the semiconductor device according to Embodiment 2.

FIG. 20 is a sectional view illustrating a modification of the semiconductor device according to Embodiment 2. The semiconductor device 10 shown in FIG. 20 includes a plurality of semiconductor pellets 17 encapsulated in a single resin portion 20. In the semiconductor device 10, the semiconductor pellets 17 are not stacked but mounted on the predetermined positions on the posts 12.

The semiconductor device 10 shown in FIG. 20 can be formed by performing the wire bonding for a plurality of semiconductor pellets 17 and by separating the resin encapsulation body so that a plurality of semiconductor pellets 17 are encapsulated in each resin portion 20. Accordingly, the semiconductor device 10 of the modification has an advantage that the scale of integrated circuits mounted in one package can be enlarged with a relatively low cost, in addition to the advantages of the semiconductor device 10 shown in FIG. 11.

Further, the area on the circuit board for mounting a package of the semiconductor device 10 including a plurality of semiconductor pellets 17 is smaller, compared with the total area for mounting the same number of packages each including one semiconductor pellet 17. Therefore, it is possible to reduce the total area on the circuit board for mounting the semiconductor device 10.

Figure 21:
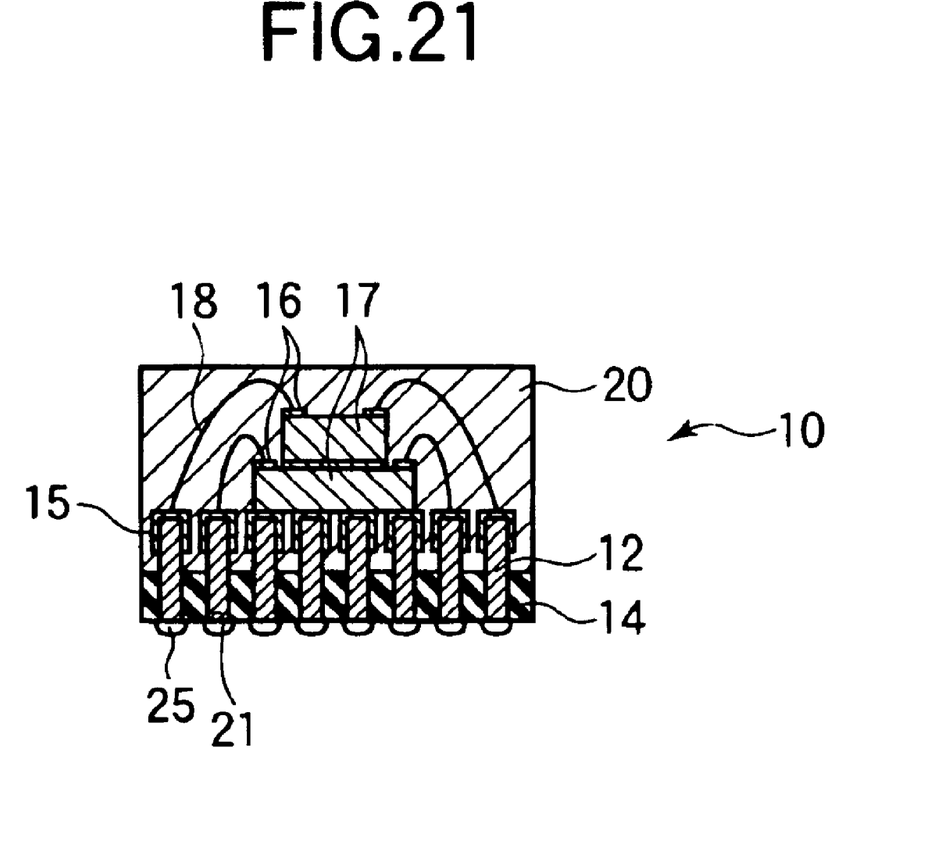
FIG. 21 is a sectional view illustrating another modified structure of the semiconductor device according to Embodiment 2.

FIG. 21 is a sectional view illustrating another modification of the semiconductor device 10 according to Embodiment 2. The semiconductor device 10 shown in FIG. 21 includes a plurality of semiconductor pellets 17 stacked in such a manner that the smaller semiconductor pellet 17 is placed on the larger semiconductor pellet 17.

According to the semiconductor device 10 shown in FIG. 21, the length of the wires (not shown) for connecting the electrodes of the semiconductor pellets 17 can be shortened. Therefore, the operation delay caused by the length of the wires 18 can be reduced, so that the semiconductor pellets 17 can be operated at high frequency.

In the above described embodiments, the post 12 has a shape of column. However, the post 12 can have other shape such as a cubic shape. Moreover, in the above described embodiments, the post 12 has a circular cross section. However, the cross section of the post 12 can be modified according to the mounting surface of the circuit board.

Furthermore, in the above described embodiments, the plated layer 15 is made of the alloy containing gold as the main ingredient. However, it is possible to use a metal which electrical loss is small, such as a silver.

In Embodiment 1, the plate member 11 is made of the alloy containing copper as the main ingredient. However, the plate member 11 can be made of an alloy containing gold as the main ingredient, or a so-called iron alloy.

In Embodiment 2, the solder plate 24 is made of the alloy containing solder as the main ingredient, and the posts are made of the alloy containing copper as the main ingredient. However, the plate member and the posts can be made of other material, so long as the plate member and the posts have electrical conductivity and the melting point of the plate is lower than the posts. For example, the posts can be made of material containing gold as the main ingredient, and the plate can be made of material containing solder as the main ingredient.

Although the terms "top," "bottom," "upper" and "lower" are used in the description above, these terms are used for convenience of description. These terms are not intended to mean the actual directions when the semiconductor device is used.

While the preferred embodiments of the present invention have been illustrated in detail, it should be apparent that modification and improvements may be made to the invention without departing from the spirit and scope of the invention as described in the following claims.

What is claimed is:

1. A manufacturing method of a semiconductor device, said semiconductor device comprising:
    a semiconductor pellet having an integrated circuit and a plurality of electrodes formed thereon;
    a resin portion encapsulating said semiconductor pellet; and
    a plurality of connection terminals to be mounted to a circuit board, said connection terminals being electrically connected to said electrodes, said manufacturing method comprising the steps of:
    forming a plurality of electrically conductive posts on a side of a plate member, said posts having first and second ends, said second ends contacting said plate member;
    forming a buffer layer on said side of said plate member so that said first ends of said posts are protruded from said buffer layer, said buffer layer supporting said posts and being able to expand and shrink according to the thermal expansion and shrinkage of said circuit board;
    mounting said semiconductor pellet on a predetermined position on said first ends of said posts;
    connecting said electrodes of said semiconductor pellet to said first ends of said posts corresponding to said electrodes, by means of wires;
    forming said resin portion on said buffer layer so that said resin portion encapsulates said posts, said wires and said semiconductor pellet;
    removing said plate member; and
    forming a plurality of connection terminals on said second ends of said posts.

2. The manufacturing method according to claim 1, wherein said forming step of said posts is accomplished by etching an electrically conductive plate.

3. The manufacturing method according to claim 1, wherein the heights of said posts on which said semiconductor pellet is placed are lower than the heights of said posts on which said semiconductor pellet is not placed.

4. The manufacturing method according to claim 1, wherein the heights of said posts increase as the distance from said semiconductor pellet increases, and the difference in height between adjacent posts is greater than the diameter of said wire.

5. The manufacturing method according to claim 1, wherein said removing step of said plate member is accomplished by grinding said plate member so that said second ends of said posts are exposed.

6. The manufacturing method according to claim 1, wherein said plate member is made of material which melting point is lower than said posts, and said removing step of said plate member is accomplished by melting said plate member.

7. The manufacturing method according to claim 6, wherein said forming step of said contact terminals is accomplished by using a molten material of said plate member remaining on said second ends of said posts as said connection terminals.

8. The manufacturing method according to claim 1, wherein said mounting step of said semiconductor pellet comprises the step of mounting a plurality of semiconductor pellets on predetermined positions on said posts.

9. The manufacturing method according to claim 1, wherein said mounting step of said semiconductor pellet comprises the step of stacking a plurality of semiconductor pellets in layer on said posts.

10. The manufacturing method according to claim 1, wherein said buffer layer is made of resin mixed with glass fibers.

11. The manufacturing method according to claim 1, wherein said forming step of said posts further comprises the step of plating said first ends of said posts so that plated layers are formed on said first ends of said posts.

* * * * *